United States Patent [19]
Alfaro et al.

[11] Patent Number: 5,491,418
[45] Date of Patent: Feb. 13, 1996

[54] AUTOMOTIVE DIAGNOSTIC COMMUNICATIONS INTERFACE

[75] Inventors: Enrique J. Alfaro, West Bloomfield, Mich.; Erwin Frank, Bischofsheim, Germany

[73] Assignee: General Motors Corporation, Detroit, Mich.

[21] Appl. No.: 330,539

[22] Filed: Oct. 27, 1994

[51] Int. Cl.⁶ .............................. B60L 1/00; F02P 17/00
[52] U.S. Cl. .................. 324/402; 307/9.1; 307/10.1; 439/34; 340/825.07; 364/424.03
[58] Field of Search ..................... 324/378, 402, 324/691; 307/9.1, 10.1, 10.5; 439/34, 620, 634; 340/825.07, 438; 364/424.03

[56] References Cited

U.S. PATENT DOCUMENTS

| | | | |
|---|---|---|---|
| 4,694,408 | 9/1987 | Zaleski | 364/551 |
| 4,831,560 | 5/1989 | Zaleski | 364/551.01 |
| 4,862,371 | 8/1989 | Maekawa | 364/431.11 |
| 4,967,143 | 10/1990 | Raviglione et al. | 324/378 X |
| 5,056,023 | 10/1991 | Abe | 364/424.03 |

Primary Examiner—Maura K. Regan
Assistant Examiner—Glenn W. Brown
Attorney, Agent, or Firm—Michael J. Bridges

[57] ABSTRACT

A diagnostic tool having a communications interface adapter for flexible diagnostic communications with automotive vehicle electronic devices automatically identifies, when connected to the adapter, the vehicle type associated with the adapter, and automatically establishes from stored communications information, the diagnostic communications format under which the electronic devices associated with the identified vehicle type communicate. Diagnostic tool communications hardware is then automatically initialized to prepare for diagnostic communications with minimum operator intervention.

11 Claims, 3 Drawing Sheets

AUTOMOTIVE DIAGNOSTIC COMMUNICATIONS INTERFACE

FIELD OF THE INVENTION

This invention relates to automotive vehicle diagnostic and, more specifically, to an automated approach to interfacing a diagnostic tool with a variety of automotive electronic devices.

BACKGROUND OF THE INVENTION

Diagnostic tools are generally available for diagnostic testing of automotive vehicle electronic devices. The communication protocol used for diagnostic communications between the devices and the tools may vary from device to device in a single vehicle or may vary over the wide range of vehicle makes, models, or model years that are to be diagnosed. Conventional diagnostic tools may support only one communication protocol, or may need to be manually reconfigured to support communication protocol variations. Even after manual reconfiguration, which may significantly delay the diagnostic test process and which increases part wear and the potential for reconfiguration error, the conventional tool may only support communication with a limited number of automotive electronic devices. Accordingly, more than one diagnostic tool may be required for diagnostic testing of even a single automotive vehicle. Furthermore, to establish communications with an individual electronic device on a vehicle, the diagnostic tool operator may be required to carry out a significant initialization and identification process which is time consuming and is prone to error.

To maintain the necessary number of up to date diagnostic tools needed for diagnostic testing of a variety of vehicle makes, models or model years may involve considerable expense. Manual reconfiguring of conventional diagnostic tools or switching between diagnostic tools to accommodate electronic device of various communication protocols is cumbersome and time consuming.

Accordingly, it would be desirable to diagnose automotive vehicle electronic devices with a single tool capable of communicating under a broad range of communication protocols without manual reconfiguration and without lengthy manual device identification and initialization processes.

SUMMARY OF THE INVENTION

The present invention is directed to a desirable diagnostic tool having a communications interface including diagnostic communications circuitry and a diagnostic connector adapter for diagnosing a broad range of automotive vehicle electronic devices with minimal manual reconfiguration, initialization or device identification.

More specifically, in accord with a first aspect of this invention, automatic vehicle identification and diagnostic tool initialization are provided through a vehicle specific connector adapter including an electrical element coded to identify the communications configuration of the vehicle electrical devices that are to be diagnosed. The vehicle is interfaced to the tool via the connector adapter. When interfaced to the vehicle, the diagnostic tool automatically reads the electrical element code and thereby identifies the communication configuration. Diagnostic communications initialization is then provided as required according to pre-established vehicle communication specifications.

In accord with a further aspect of this invention, following vehicle identification and diagnostic communication initialization, the diagnostic tool of this invention establishes basic communication links with the vehicle so as to support communication with electronic devices known to be included on the vehicle. Trigger thresholds, communication channels, voltage pull-up values, and communication rates may be referenced as being associated with the devices of the vehicle corresponding to the identifying device.

In accord with yet a further aspect of this invention, vehicle identification verification may be automatically provided by comparing received communication data from the devices on-board the vehicle to data that would normally be associated with the vehicle that had previously been identified. The operator may be prompted in the event of a vehicle identification error.

BRIEF DESCRIPTION OF THE DRAWINGS

The invention may be best understood by reference to the preferred embodiment and to the drawings in which.

DESCRIPTION OF THE PREFERRED EMBODIMENT

Figure 1:
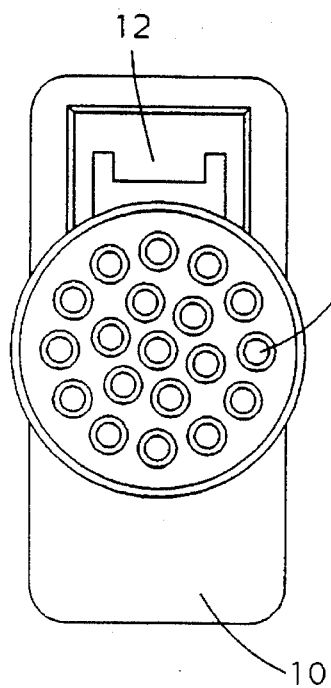
FIGS. 1–3 illustrate features of a connector adapter for identifying an automotive vehicle in accord with this invention.

Referring to FIG. 1, front view of connector adapter 10 details a front connector portion of the adapter that is formed to mate with a corresponding male connector electrically attached to a diagnostic tool. The connector adapter 10 provides, on the front connector portion thereof, an interface with the diagnostic tool. The front connector portion is configured, in this embodiment, as a commercially available 19 pin female Burndy type connector, for electrical connection to a 19 pin, male Burndy type connector. Other connector configurations may be used within the scope of this invention to provide connection between connector adapter and a diagnostic tool. Within a front slot 12 of front connector portion, a series of orifices are provided, such as orifice 14, for receiving pins from a corresponding male Burndy type connector to which the front connector portion may be interfaced.

Figure 3:
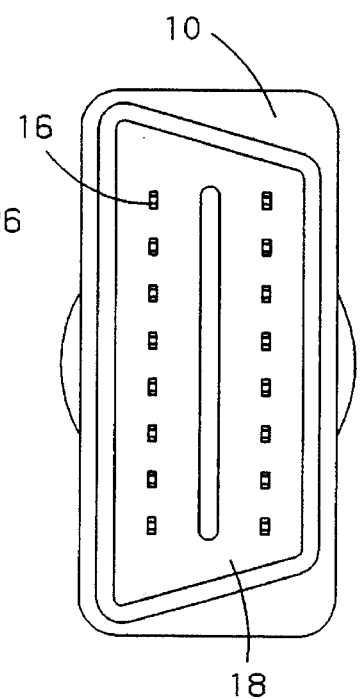

FIG. 3 is a rear view of connector adapter 10. The rear view opposes the front view of FIG. 1. A rear connector portion is detailed in FIG. 3 having one of a plurality of connector configurations. For example, a sixteen pin male S.A.E. J 1962 type connector may make up the rear connector portion, as illustrated in FIG. 3. A series of pins, such as pin 16, extend out from a receiving socket 18 of the rear connector portion for penetration into a corresponding number of slots on a female connector to which the rear connector portion may be interfaced. With such a connector adapter as that of FIG. 3, connection may be made between a diagnostic tool having a male 19 pin Burndy connector and devices using S.A.E. J 1962 type connectors. Furthermore, a variety of connector adapters may be available for use with the diagnostic tool in accord with this invention. The diagnostic tool of the present embodiment is capable of communication with each of a plurality of electronic devices on an automotive vehicle. Such communication may be carried out with a number of such electronic devices contemporaneously. Furthermore, the diagnostic tool is transportable between different automotive vehicles which may employ different communication protocols and have different connectors for interfacing with diagnostic tools. To accommodate such varying connectors, connector adapters are provided in this embodiment, all having a Burndy type connector on the front connector portion thereof, and each having a different connector type on the rear connector portion thereof. For example, the rear connector portion illustrated in FIG. 3 may be other than the S.A.E. J 1962 type connector. The rear connector portion may be configured in accord with conventional connector types used in automotive vehicles for diagnostic communications. The extent of the variety of such connectors should only be limited by the number of diagnostic connector types available in the art for diagnosing electronic devices on automotive vehicles. The number of connector pins and the configuration of the pins of the rear connector portion may vary significantly from adapter to adapter, while all having a common connector type on the front connector portion. Accordingly, a single diagnostic tool having a single diagnostic communications interface may be used for communication with a substantially unlimited number of electronic devices on automotive vehicles, each of which device or vehicle may have a unique communications interface, without changing the diagnostic tool connector or vehicle diagnostic communications connector.

Figure 2:
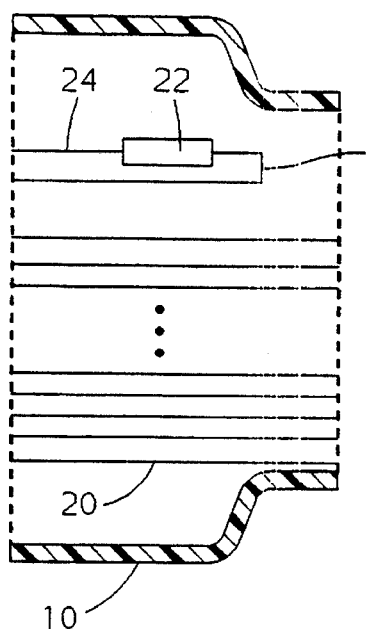

To further accommodate the variety of devices and vehicles with which the diagnostic tool of this embodiment may communicate, adapter circuitry is provided within the connector adapter 10, as schematically described in FIG. 2, which is a side cutaway schematic view of the connector adapter 10 of FIGS. 1 and 3. Electrical conductors, such as conductor 20, conduct electrical signals between the pins or slots of the front and rear connector portions. The number of electrical conductors may vary for each of the described plurality of connector adapters, wherein not all of the 19 pins of the Burndy connector at the front connector portion may be carried through to the rear connector portion of the adapter 10. Common to each adapter in accord with this invention is adapter circuit element 22, provided to identify the device or vehicle connected to the rear connector portion of the adapter. As described, each automotive vehicle or electronic device to be diagnosed through communication across adapter 10 may have a dedicated diagnostic communication interface, and thus may have a dedicated connector adapter, such as adapter 10. To provide identification of the device or vehicle to be diagnosed, the device-specific or vehicle-specific circuit element 22 is provided, such as a circuit element having an amount of electrical resistance, capacitance, or inductance that is unique to the device or vehicle that may be interfaced through the rear connector portion of the corresponding connector adapter. Further identification information relating to the vehicle or device may be made through analysis of communication data received from that device or vehicle, as will be described.

The circuit element 22 is electrically connected to dedicated slots or orifices of the Burndy connector at the front connector portion of the connector adapter 10 through electrical conductors 24 and 26 connected electrically to each side of the element 22. For any connector adapter, such as adapter 10 of FIGS. 1–3, the same two slots or orifices at the front connector portion are electrically connected to the corresponding conductors 24 and 26, so that, in accord with a critical feature of this invention, when the diagnostic tool is attached to the connector adapter 10 at the front connector portion thereof, the diagnostic tool may read the value of the element 22 by examining information at the same two input pins of the male Burndy type connector of the diagnostic tool. For any of the variety of devices or vehicles to which the diagnostic tool may be attached to carry out diagnostic operations, the same two pins of the diagnostic connector may thus be examined to determine important information about the type of device or vehicle that is being diagnosed. The manner of making such examination of the two pins in accord with the preferred embodiment of this invention will be described.

Figure 4:
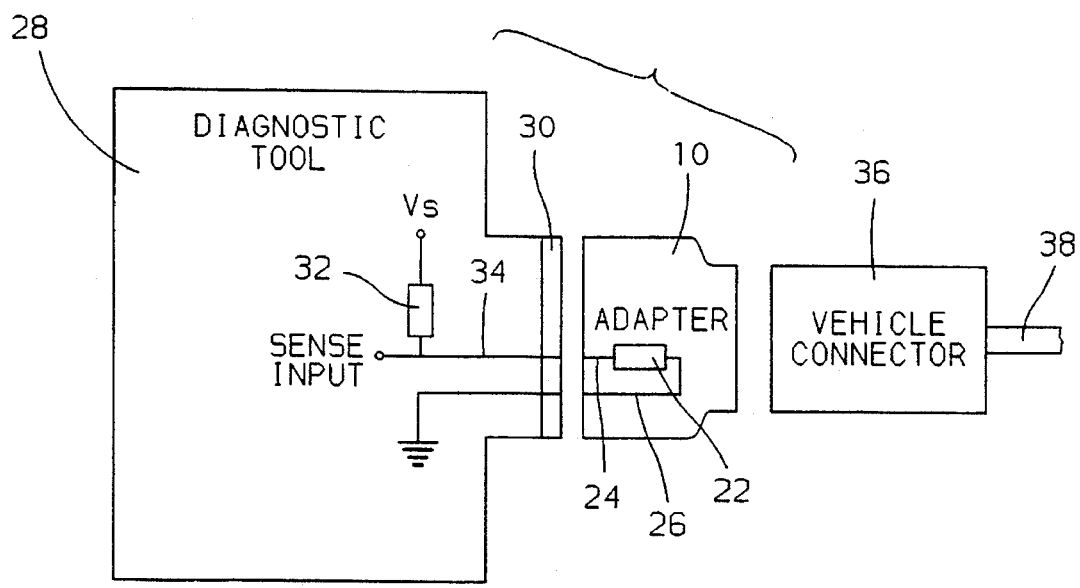
FIG. 4 details vehicle identification circuitry included in the connector adapter of FIGS. 1–3.

FIG. 4 schematically illustrates the electrical circuit formed upon connecting the connector adapter 10 having circuit element 22 to diagnostic tool 28 via a connector portion 30 of the diagnostic tool. The connector portion 30 in this embodiment includes a nineteen pin male Burndy type connector, as described. The connector portion 30 may further include a conventional cable connecting the pins of the male Burndy type connector with the diagnostic tool, wherein the end of the cable opposing the end having the male Burndy type connector includes a connector that may be attached to a mate connector on the diagnostic tool 28. Such connector and cable hardware is generally illustrated by connector portion 30 of FIG. 4.

Upon connecting the adapter 10 with the connector portion 30, a circuit is formed, wherein a source voltage Vs, which may be approximately twenty volts in this embodiment, is tied to a first side of pull-up resistor 32 of approximately 3.74 kilohms. A second side of resistor 32 is electrically connected to signal line 34 which connects electrically to signal line 24 of adapter 10 through connector portion 30, for connection to a first side of circuit element 22. The signal line 26 of adapter 10 is returned through connector portion 30 where it is tied to a ground reference. The ground reference may be linked to a ground reference signal that passes through the adapter 10 to vehicle connector 36 and out to a vehicle or electronic device to be diagnosed via communications link 38. A common ground may thus be formed between the diagnostic tool 28 and any vehicle electrical system or any device to be diagnosed, in accord with general vehicle communications practices.

A sense input taps into signal line 34 for monitoring the electrical signal passing across such line, to identify the electronic device or the automotive vehicle being diagnosed. The sense input may be provided to sensing circuitry or to an electronic controller, so that action may be taken to identify the device or vehicle under test, and to carry out proper diagnostics for such device or vehicle. For example, in the embodiment of this invention in which the electronic device is a simple electrical resistor, a voltage sampled on signal line 34 may indicate the approximate resistance of the resistor, as the approximate magnitude of Vs and the resistive element 32 are known. Voltage sample information may be provided to a controller, such as through an analog to digital converter, and the controller may apply the sample information to a predetermined lookup table in non-volatile memory to reference information about the device or vehicle under test. The referenced information may be used by the controller or other diagnostic hardware for a number of operations. For example, such information may be used to set up voltage thresholds particular to the device or vehicle to which the diagnostic tool is connected, to configure multiplexers so that active pins of the adapter 10 may be monitored by the controller and diagnostic hardware for input information, or may be used to output information to the device or vehicle.

When a different adapter having a circuit element 22 with a different value is connected to connector portion 30 of the diagnostic tool 28, a different voltage will appear and be sampled at sense input on line 34, different identification information will be referenced from the lookup table in response to the different voltage and different operations will result, such as different voltage thresholds being set up, different multiplexer configurations being used, etc.

Figure 5:
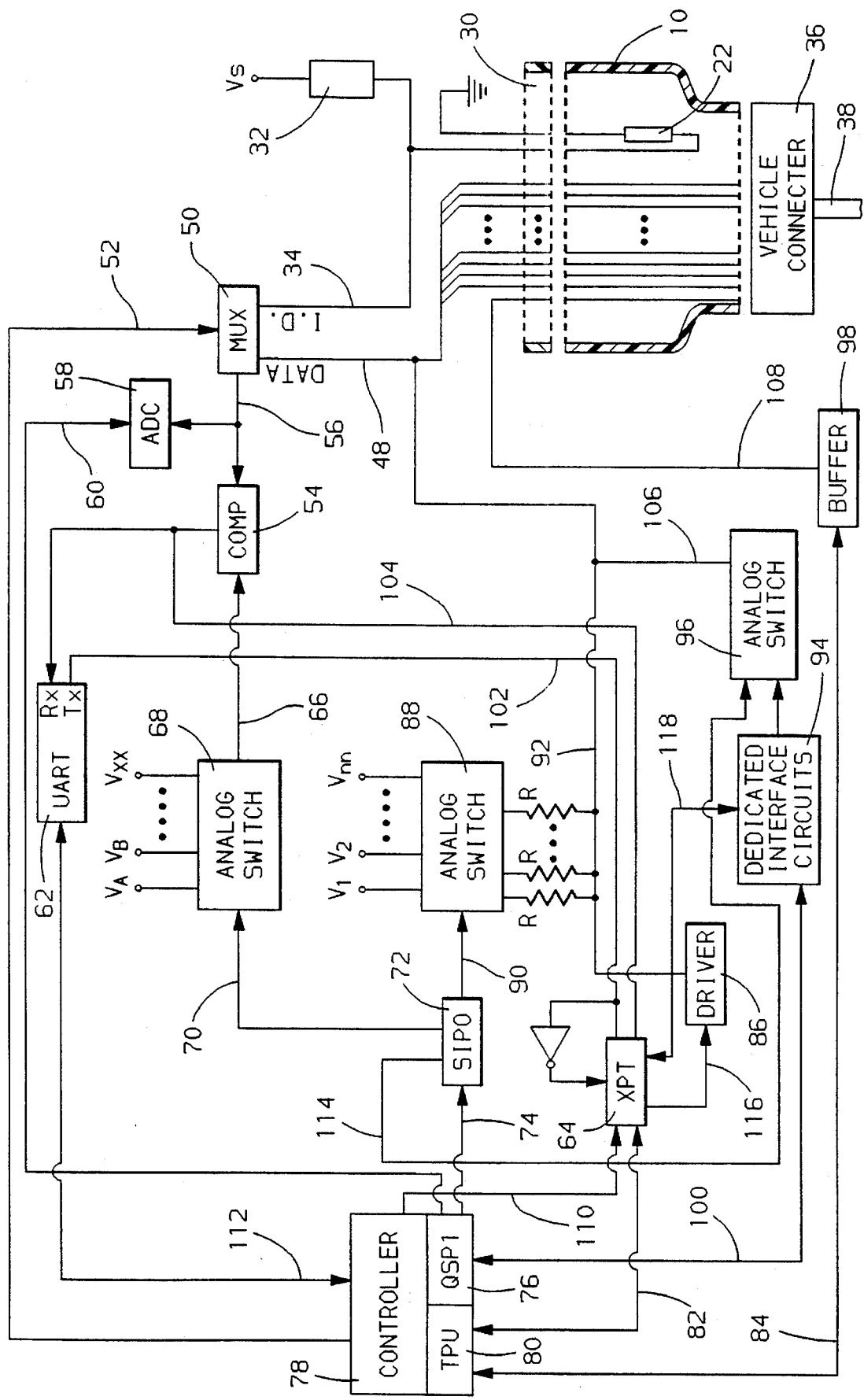
FIG. 5 schematically illustrates an interface of the connector adapter of FIGS. 1–3 with diagnostic communications interface circuitry in accord with the preferred embodiment.

Referring to FIG. 5, a diagnostic tool circuit schematic details diagnostic communications hardware for interfacing a controller 78, such as a commercially available Motorola MC68332, to electronic devices on an automotive vehicle. The controller 78 exercises the hardware of FIG. 5 for communicating diagnostic information to and from at least one electronic device on an automotive vehicle. Vehicle diagnostic link 38 terminates at vehicle connector 36 which interfaces with adapter 10, wherein the adapter is manually selected to provide for connection between vehicle connector 36 and diagnostic tool connector portion 30 to support diagnostic communications between the electronic device or devices and the controller 78. Adapter 10 includes electrical element 22 for vehicle or device identification, as described. Output signal ID is provided to at least one of a predetermined number of conventional multiplexers, such as conventional multiplexer part no. DG406DN, wherein the umber of multiplexers are represented by MUX 50.

Controller 78 communicates a select signal via control line 52 to each MUX dictating the input line from the set of input data lines 48 to be passed through to the MUX output line 56. Conventional 10-bit analog-to-digital converter ADC 58, which may be commercially available part no. ADC10732, monitors the output line 56 and provides a digital equivalent of the analog signal thereon to controller 78. Upon initial device hookup to the diagnostic hardware of FIG. 5, controller 78 issues a select signal on line 52 directing the at least one multiplexer, represented by MUX 50, to pass through the ID input on line 34 to the MUX output line 56. The controller then reads the voltage signal on line 56 via ADC 58 and references from controller non-volatile memory (not shown) information on the device corresponding to such voltage on line 56. Controller 78 then may set up diagnostic communications by directing each of the number of multiplexers 50 to pass through a unique vehicle serial communications input signal from the vehicle communications link 38. In this manner the diagnostic hardware of FIG. 5 may be efficiently reconfigured for varying vehicle serial communication mechanizations, wherein different connector portion 30 pins may receive diagnostic communications from various vehicle electronic devices. A single adapter interface, such as connector portion 30 may be used and, beyond inserting the proper adapter 10 between the vehicle connector 36 and the diagnostic tool connector portion 30, no operator interaction is required for reconfiguration between different vehicle makes, models, or model years.

The output signal, such as the signal on line 56, from each of the multiple multiplexers, such as MUX 50, is provided to a corresponding comparator 54, part no. LM393, for discerning binary signal information and for passing such information through to further hardware stages and ultimately to the controller 78. To accommodate varying voltage thresholds of the communication information that may be incoming from various serial communication channels, so as to accommodate various communication protocols, the comparators, such as COMP 54, have varying voltage thresholds above and below which the voltage level of incoming serial data is recognized as respectively, high and low binary information. The thresholds are selectable by controller 78 with benefit of the identification information from the analog to digital converter ADC 58. For example, the controller 78 dictates the data line from the set of data lines 48 to pass through a corresponding one of the set of multiplexers, such as MUX 50. The controller 78 likewise has information pertaining to the voltage threshold of the serial information passed through the multiplexers, and may select a threshold matching the desired voltage threshold by communicating serially such information via its serial output line 74 to conventional SIPO 72 or the conventional output driver device, which sets up the threshold via its output select line 70. The select line 70 is provided as an input select line to an analog switch 68, part no. DG445, having selectable voltage inputs VA, VB, . . . VXX. One or more analog switches may be used for passing an appropriate threshold voltage through to each of the comparators, such as COMP 54. Conventional digital to analog converters may be used instead of the analog switches represented by switch 68 for selection of voltage reference values. The voltage signal VA applied to analog switch 68 may correspond to a TTL threshold voltage, VB may correspond to an RS 232 communications threshold, etc. Any expected serial communications threshold may be included in the selectable range of the analog switch or switches 68. Accordingly the input signal comparators, such as COMP 54 may be used to receive and decode binary information from a variety of sources. Comparator output signal on line 104 may be provided to the receive pin of a conventional UART 62, part no. 16C2550, for decoding and forwarding to controller 78 via line 112. Further, UART output line 102 may be provided to a conventional 16×8×1 cross point switch XPT 64, part no. CD22M3494, such as controlled by controller 78 via control line 110 to distribute various diagnostic input and output information through the stages of the hardware of FIG. 5. For example, the XPT 64 communicates bi-directionally with a Time Processing Unit TPU 80 of controller 78, for input signal timing measurement and generation of time-based output signals. Such TPU functions are generally known and practiced in the art. The XPT 64 may provide input signal information to the TPU 80 for analysis of signal duration or frequency, or the TPU 80 may be used for UART emulation with TPU output information easily accessed by controller 78, and the TPU 80 may output pulsetrain information, timed individual pulses, or serial communications data to the XPT 64, and the controller 78 may direct the XPT to pass such information on, via output stages of the diagnostic hardware of FIG. 5, ultimately to vehicle electronic devices, so as to carry out conventional device diagnostics. The XPT 64 acts as a switching device for controller or TPU communications to various stages of the hardware of FIG. 5. UART transmit output signal on line 102 is provided in both inverted and non-inverted form directly to XPT 64, so as to be passed on to controller 78. Two-way serial communications are provided on a plurality of communication links, such as represented by link 118 between XPT 64 and dedicated interface circuits 94, for protocol handling of a variety of communications protocols including CCD serial communications, SAE J1850 communications, SAE J1708 communications, ISO 9141, CAN 3.0, and other protocols generally available for vehicle serial communications. The configuration of each of such interface circuits may be as described in generally available S.A.E. or manufacturer specifications.

Incoming data may be received by the XPT 64 via line 104 and forwarded, as dictated by control information on line 110 from controller 78, to the appropriate one of the dedicated interface circuits 94 required for decoding of such serial information. The decoded diagnostic information may be provided directly to controller 78 via a queued serial peripheral interface circuit 76 via line 100, or may be provided to UART 62 for further decoding, or may be passed through XPT 64 to TPU 80 for analysis. To accommodate additional communication protocols, additional dedicated interface circuits may by added to the circuitry of FIG. 5, simply by including the standard interface circuitry commercially available for supporting such protocols with that of the circuitry 94, and by linking such additional circuitry to the XPT 64, the QSPI 76 and the analog switch 96, part no. DG445, so that encoding and decoding of such additional communication protocols may be provided when the controller 78, in accord with predetermined hardware configuration information, requests communication under the additional protocols.

Output signal information from controller 78 may be issued directly to the appropriate vehicle electronic device via buffered serial communication line 84 connected to signal buffer 98 and output to connector portion 30 via line 108. Alternatively, output data may pass from TPU 80 of controller 78 to cross point switch XPT 64 for communication to the dedicated interface circuits 94, or may be provided directly to interface circuits 94 through queued serial communications from QSPI 76 of controller 78. After implementing the appropriate communications protocol, the interface circuits 94 provide the diagnostic output information to analog switch 96 which operates under control of controller 78 via output lines 114 of SIPO 72, for directing output signal information to an appropriate output signal line so that it passes to the appropriate electronic device on the vehicle. The output lines of analog switch are generally illustrated as line 106.

Alternatively, for communications protocols requiring specialized voltage pull-up values, the interface circuit 94 output may be provided to XPT 64, which may be directed by controller 78 to pass the interface circuit output to a series of line drivers 86, part nos. BUK583, via a plurality of lines illustrated generally as line 116. The output of the series of drivers 86 is passed to connector portion 30 for output to the appropriate electronic device on the vehicle. The output illustrated as line 116 may include a plurality of individual output lines, each of which may be pulled up to an appropriate voltage level, such as a five volt level, a twelve volt level, or other conventional voltage level as may be required for operation of the corresponding conventional automotive electronic device. A series of voltage inputs are provided to analog switch 88, part no. DG445, including V1, V2, . . . , Vn, each of which has a predetermined voltage level such as may be provided by dedicated power supplies (not shown) or generated through conventional voltage divider circuitry. A select line 90 from SIPO 72 operating under control of controller 78 directs a voltage pull-up from the set V1, V2, . . . , Vn to be applied to each of the output lines 92 in accord with the identification information received from adapter 10 and any other identification received by controller 78, such as from ADC 58, on the voltage levels required for communication with the various devices currently being tested. Pull-up resistors R are provided between each of the selectable voltage levels input to analog switch 88 and the output lines 92, wherein a single resistor value R may be used by all lines, or the resistance value may vary from line to line.

Figure 6:
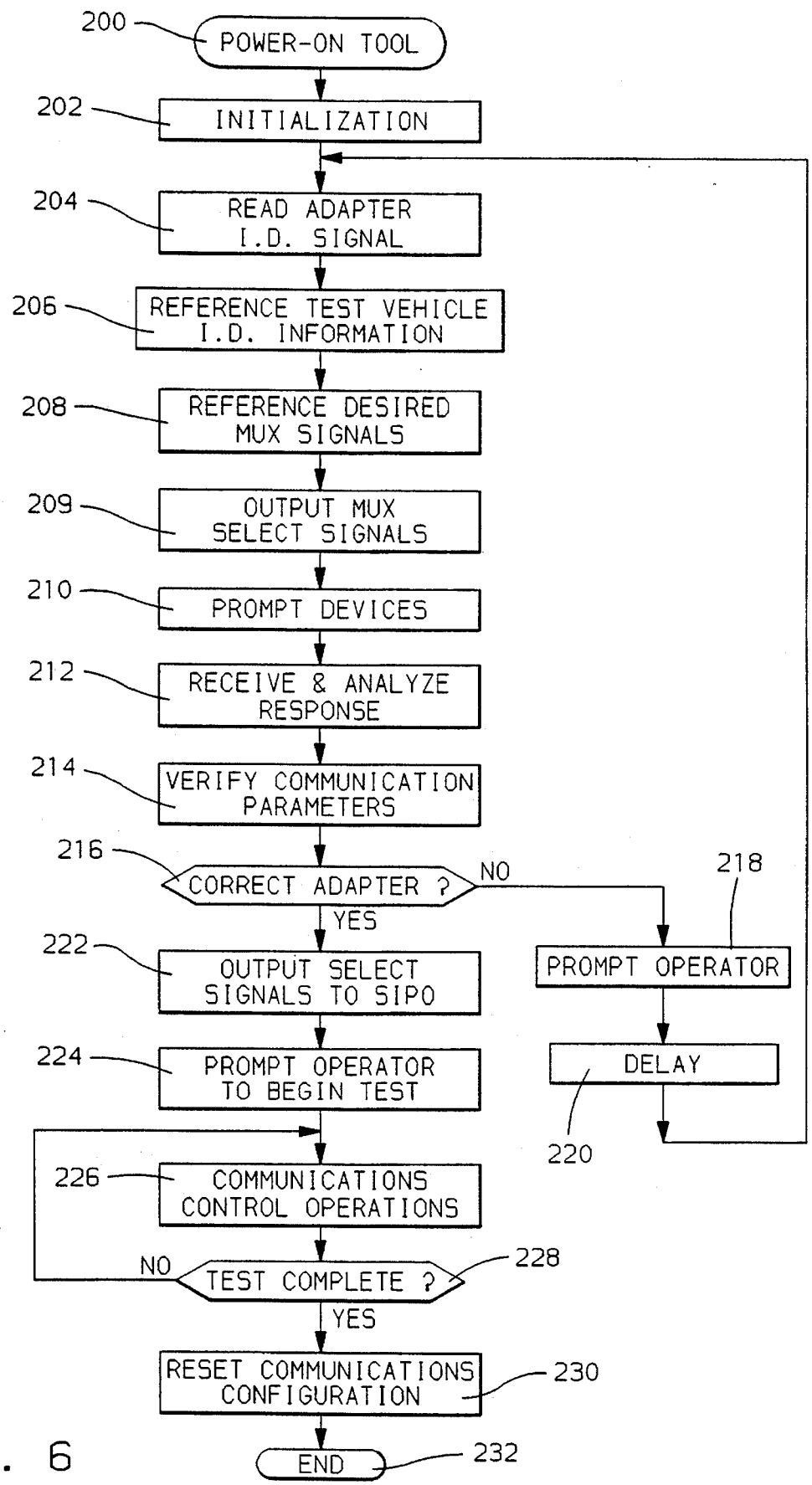
FIG. 6 details a flow of diagnostic communications control operations for communicating across the circuitry of FIG. 5.

FIG. 6 illustrates a flow of controller 78 operations for vehicle and electronic device identification and for setting up and carrying out diagnostic communications in accord with this invention. The flow of operations are provided for general illustration of a startup of controller at the beginning of a diagnostic test, at which it attempts to identify the vehicle under test and to establish a communication setup compatible with the communications link of that vehicle. Referring to FIG. 6, when power is applied to the diagnostic tool having hardware illustrated schematically in FIG. 5, such as when a vehicle operator turns the tool on after connecting the tool to at least one automotive vehicle electronic device through a vehicle connector using the adapter 10 of FIG. 5 suited to the vehicle connector, the controller operations generally begin at a step 200 and proceed to a step 202 to carry out initialization operations, such as may include conventional power-on self-test functions, memory clearing operations, reset operations for pointers, flags and counters, and other generally-understood start-up operations. The routine then reads the adapter ID signal at a step 204, such as by selecting the ID signal line 34 of FIG. 5 to pass through MUX 50 to MUX output line 56 and then by reading the ADC output signal on line 60 indicating the value of the electrical element 22 of FIG. 5. After reading the ID signal, test vehicle identification information is referenced at a step 206, wherein such information may include vehicle make, model year, model and other identification information. This identification information may be referenced by selecting the vehicle identification information from a conventional lookup table in controller non-volatile memory that is stored corresponding to the value of the ID signal read at the step 204.

Next, desired MUX signals are referenced from controller non-volatile memory as the MUX configurations corresponding to the identified vehicle. For example, if the identified vehicle has three serial data lines for diagnostic communications with a respective three vehicle electronic devices, and the three lines are connected to pins 2, 4, and 6 of connector portion 30, then the referenced desired MUX signals may indicate that a first MUX, such as MUX 50 of FIG. 5, should pass through information on pin 2 to its output line 56, the second MUX should pass through information on pin 4 to its output line, and the third MUX should pass through information on pin 6 to its output line. In this manner, any active serial data lines carrying diagnostic communications may be passed through to a corresponding MUX for analysis by a corresponding comparator, such as COMP 54 of FIG. 5, so that such diagnostic communications may be made available to controller 78.

After referencing the desired MUX signals, select signals are output to each active MUX at a step 209 to configure each active MUX to pass through a corresponding serial data channel. The vehicle electronic devices are next prompted at a step 210 to trigger device response communications, which may be used for verification of communication parameters, such as pull-up and threshold voltage values and communication frequencies. Device responses to the prompt of step 210 are next received and analyzed at a step 212 which may require a delay to wait for such responses to be received. The received signals are analyzed for identification of communication parameters such as pull-up and threshold voltage values and communication frequency values. Such parameters may be used by controller 78 of FIG. 5 for communications control with such devices or for verification of previously established communication parameters for the devices under test. Such verification may be made at a next step 214 at which previously established communication parameters are compared to values identified at the step 212. If any values do not correlate at the step 214, the routine may determine at a next step 216 that an incorrect adapter is present in the system, for example if the communication parameters that did not correlate were initially established through the analysis of the adapter circuitry at the described step 204. If an incorrect adapter is determined to be present, the routine moves from the step 216 to notify the tool operator of such incorrect adapter at a step 218, such as by prompting the operator using any display that may be included with the diagnostic tool, and then by delaying for a short period at a step 220 to allow the operator to take note of the incompatibility and to correct it, and then the routine returns to the step 204 and repeats steps 204–216 to again establish communications and verify that the correct adapter is in place.

Returning to the step 216, upon determining that the correct adapter is in place, the controller 78 outputs select signals via its QSPI unit 76 to SIPO 72 for application to analog switches 68 and 88 at a next step 222, so that output communication pull-up values may be applied to outgoing communication signals that are compatible with the communications protocol of the electronic devices to which they will be passed, and so that comparators, such as COMP 54, may decode input communications at the appropriate voltage reference thresholds, as described. The select signals may be predetermined as the signals needed to pass the appropriate voltage levels through each of the analog switches to allow for corresponding voltage levels to be applied to communications signals, as was described for the hardware of FIG. 5.

The operator is next prompted to begin the diagnostic test at a step 224, such as by indicating that the diagnostic tool is ready for testing on any display that may be included with the diagnostic tool. Communications control operations are then executed at a step 226, during which operations the control described for the hardware of FIG. 5 is provided in response to operator-requested interactions with various of the automotive electronic devices, wherein control commands are issued by controller 78 for each of various electronic devices, the commands are passed through to the appropriate encoding hardware of FIG. 5 to translate the commands to the applicable communications protocol used by the electronic device to receive the commands, and the translated commands are output to the electronic devices. Response information from the devices is received and decoded through the hardware of FIG. 5, and is passed to controller 78 in a form usable by controller for diagnosing the devices. Such generally described operations continue on until the operator's diagnostic operations are complete, and when complete as determined at a step 228, the communications configuration is reset at a next step 230 to prepare for the next diagnostic test, perhaps on a different vehicle make or model or model year. The reset operations of the step 230 may include clearing analog switch settings of comparator threshold levels or of pull-up values, clearing of multiplexer selections, and clearing of controller memory values pertaining to vehicle or electronic device identification. The test routine then ends at a step 232 to await a later startup at the beginning of a next diagnostic test.

The preferred embodiment for explaining this invention is not to be taken as limiting or restricting the invention since many modifications may be made through the exercise of ordinary skill in the art without departing from the scope of the invention.

The embodiments of the invention in which a property or privilege is claimed are described as follows:

1. An automotive vehicle diagnostic communications interface method for interfacing a diagnostic tool having a tool connector with an automotive vehicle having a vehicle connector to provide for diagnostic communications between the diagnostic tool and electronic devices on-board the automotive vehicle, comprising the steps of:

establishing a schedule of predetermined diagnostic communication configurations having a plurality of elements each of the plurality of elements of the schedule corresponding to one of a plurality of automotive vehicle diagnostic classifications;

providing a connector adapter for each of the plurality as the connector adapter that is used as a diagnostic communications interface therewith;

selecting a connector adapter from the provided connector adapters as the connector adapter providing a diagnostic communications interface between the tool connector and the vehicle connector;

applying the selected connector adapter to the tool connector; and activating the diagnostic tool whereby the diagnostic tool automatically establishes communications with the vehicle electronic devices via the applied connector adapter, by (a) detecting which connector adapter from the provided connector adapters has been applied to the diagnostic tool, (b) referencing the diagnostic communications configuration corresponding to the vehicle diagnostic classification for which the detected connector adapter has been applied, (c) configuring the diagnostic tool in accord with the referenced diagnostic communications configuration, and (d) providing diagnostic communications with the vehicle electronic devices under the diagnostic tool configuration.

2. The method of claim 1, wherein each of the predetermined set of connector adapters includes an electrical device having an electrically measurable value and wherein the value of each of the electrical devices is distinguishable from the values of the others of the electrical devices, the detecting step further comprising the steps of:

measuring the value of the electrical device included in the selected connector adapter after the selected connector adapter has been applied to the diagnostic tool; and determining the applied connector adapter as the connector adapter including a device with a value substantially corresponding to the measured value.

3. An automotive vehicle diagnostic communications interface across which a diagnostic tool having a tool connector communicates with electronic devices of a predetermined plurality of automotive vehicle classes, wherein each of the predetermined plurality is characterized by a particular vehicle diagnostic connector, comprising:

a plurality of connector adapters each of which plurality is particular to a one of the plurality of automotive vehicle classes for providing a diagnostic communication connection between the particular vehicle diagnostic connector characteristic of such class and the tool connector;

sensing circuitry included with the diagnostic tool for sensing, when the diagnostic communication connection has been provided, the connector adapter providing the diagnostic communication connection; and a controller included with the diagnostic tool responsive to the sensed connector adapter for identifying the one of the predetermined plurality of automotive vehicle classes to which the sensed connector adapter is particular.

4. The interface of claim 3, wherein each of the predetermined plurality of automotive vehicle classes carries out diagnostic communications according to a distinct communication format, the automotive vehicle diagnostic communications interface further comprising:

communications configuration circuitry for establishing, upon identifying the one of the predetermined plurality of automotive vehicle classes, diagnostic communications under the communication format of the identified one of the predetermined plurality of automotive vehicle classes.

5. The interface of claim 3, wherein each of the connector adapters further comprises:

an electrical element having a predetermined measurable value particular to its corresponding connector adapter;

and wherein the sensing circuitry senses the connector adapter by measuring the value of the electrical element particular to the connector adapter providing the diagnostic communication connection.

6. The interface of claim 5, wherein the electrical element is an electrical resistor embedded in the connector adapter.

7. An apparatus for identifying automotive vehicle electronic devices to be diagnosed by a diagnostic tool having a tool connector for diagnostic communications, comprising:

a vehicle connector for diagnostic communications with the automotive vehicle electronic devices;

a connector adapter for adapting the tool connector to the vehicle connector to provide for diagnostic communications between the automotive vehicle electronic devices and the diagnostic tool;

an electrical element having a predetermined, electrically measurable value for identifying the automotive vehicle electronic devices, the electrical element disposed on the connector adapter;

the diagnostic tool having measuring circuitry for measuring the predetermined, electrically measurable value of the electrical element when the connector adapter is connected to the diagnostic tool;

a stored schedule of electronic device identification information sets, each set paired with an electrical element value; and a controller for referencing the electronic device identification information set corresponding to the measured electrical element value to identify the automotive vehicle electronic devices.

8. The apparatus of claim 7, wherein, upon identifying the automotive vehicle electronic devices, the controller configures the diagnostic tool for diagnostic communications with the identified automotive vehicle electronic devices.

9. The apparatus of claim 7, wherein the electrical element is an electrical resistor.

10. The apparatus of claim 7, wherein the connector adapter further comprises:

a front connector portion sized for mechanical attachment to the vehicle connector; and a rear connector portion sized for mechanical attachment to the diagnostic tool connector.

11. The apparatus of claim 10, wherein the electrical element has upper and lower electrical connection terminals, and wherein the connector adapter further comprises:

electrical conductors for conducting electrical signals between the front and rear connector portions to provide for diagnostic communications between the diagnostic tool and the automotive vehicle electronic devices;

an upper conductor for conducting electrical signals between the rear connector portion and the upper connection terminal;

a lower conductor for conducting electrical signals between the rear connector portion and the lower connection terminal;

and wherein when the rear connector portion is mechanically attached to the diagnostic tool connector the measuring circuitry is electrically connected to the upper and low conductors for measurement of the electrical element value.

* * * * *